United States Patent
Yoshioka et al.

(10) Patent No.: US 9,474,193 B2
(45) Date of Patent: Oct. 18, 2016

(54) BONDED COMPACT AND METHOD OF PRODUCING GREEN BONDED COMPACT

(71) Applicant: NGK Insulators, Ltd., Nagoya (JP)

(72) Inventors: Kunihiko Yoshioka, Nagoya (JP); Satoshi Ishibashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 293 days.

(21) Appl. No.: 14/014,956

(22) Filed: Aug. 30, 2013

(65) Prior Publication Data

US 2014/0065375 A1 Mar. 6, 2014

(30) Foreign Application Priority Data

Sep. 4, 2012 (JP) ................. 2012-193916

(51) Int. Cl.
*B32B 18/00* (2006.01)
*B32B 7/02* (2006.01)
(Continued)

(52) U.S. Cl.
CPC ................ *H05K 13/00* (2013.01); *B32B 7/02* (2013.01); *B32B 18/00* (2013.01); *C04B 35/634* (2013.01); *C04B 37/008* (2013.01); *H05K 1/0306* (2013.01); *C04B 2235/604* (2013.01); *C04B 2235/608* (2013.01); *C04B 2237/348* (2013.01); *C04B 2237/62* (2013.01); *C04B 2237/66* (2013.01); *C04B 2237/704* (2013.01); *C04B 2237/708* (2013.01); *H01M 8/0215* (2013.01); *H01M 2008/1293* (2013.01);
(Continued)

(58) Field of Classification Search
CPC ...... H05K 13/00; H05K 1/0306; B32B 7/02; B32B 18/00; Y10T 428/24744; Y02E 60/521; Y02E 60/525; H01M 2008/1293; H01M 8/0215

See application file for complete search history.

(56) References Cited

U.S. PATENT DOCUMENTS

2006/0257714 A1* 11/2006 Sato .................... H01M 4/8605
429/465
2012/0148934 A1* 6/2012 Ohmori ............... H01M 8/0236
429/463

FOREIGN PATENT DOCUMENTS

JP 01-169878 A 7/1989
JP 10-242644 9/1998
(Continued)

OTHER PUBLICATIONS

Extended European Search Report (Application No. 13182734.7) dated Nov. 27, 2013.
Japanese Office Action, Japanese Application No. 2012-193916, dated Aug. 30, 2016 (5 pages).

*Primary Examiner* — Laura Auer
(74) *Attorney, Agent, or Firm* — Burr & Brown, PLLC

(57) ABSTRACT

Provided is a method of producing "a ceramic green bonded compact in which a ceramic green film is bonded on each bonding surface of a ceramic green substrate having hole portions," the method imparting good adhesiveness to a thin green film while suppressing the green substrate from having deformation. In this method, first, a layer of a paste for bonding is formed on each bonding surface of green sheets prepared. Next, each bonding surface of the green sheets on which the paste layer is formed is brought into contact, in a state in which the paste layer is wet, with each bonding surface of a porous ceramic green substrate prepared. While this state is maintained, pores in the green substrate absorb a dispersion medium in the paste layer in the wet state. As a result, the paste layer is dried, thereby completely bonding the green substrate and the green sheets.

6 Claims, 11 Drawing Sheets

(51) Int. Cl.
- *H05K 1/03* (2006.01)
- *H05K 13/00* (2006.01)
- *C04B 35/634* (2006.01)
- *C04B 37/00* (2006.01)
- *H01M 8/02* (2016.01)
- *H01M 8/12* (2016.01)

(52) U.S. Cl.
CPC .............. *Y02E 60/525* (2013.01); *Y02P 70/56* (2015.11); *Y10T 428/24744* (2015.01)

(56) References Cited

FOREIGN PATENT DOCUMENTS

| | | |
|---|---|---|
| JP | 2005-166528 A | 6/2005 |
| JP | 2007-095383 A1 | 4/2007 |
| JP | 2011-165374 A1 | 8/2011 |
| JP | 2011-165379 A1 | 8/2011 |
| JP | 2011-211033 | 10/2011 |

\* cited by examiner

BONDED COMPACT AND METHOD OF PRODUCING GREEN BONDED COMPACT

BACKGROUND OF THE INVENTION

1. Field of the Invention

The present invention relates to a bonded compact and a method of producing a green bonded compact. Herein, the term "green" refers to a state before firing.

2. Description of the Related Art

There has been conventionally known a fired compact (ceramic bonded compact) produced by bonding, on each bonding surface of "a plate-like ceramic substrate having hole portions and being formed of a ceramic," "a ceramic film having a thinner thickness than that of the ceramic substrate and being formed of a dense ceramic having a different composition or a different microstructure from that of the ceramic substrate." Herein, the term "hole portion" refers to a through-hole or a recessed portion.

In regard to such a ceramic bonded compact, JP 2011-211033 A discloses, for example, "a method involving forming an electrode pattern and a blank pattern complementing the electrode pattern on a surface of a ceramic green sheet by a screen printing method or the like, followed by drying, to prepare the resultant ceramic green sheet in a plurality of numbers, and laminating the ceramic green sheets under heat and pressure." Alternatively, JP 2011-211033 A discloses "a method involving forming an electrode pattern and a blank pattern complementing the electrode pattern on a carrier sheet by a screen printing method or the like, followed by drying, then transferring the resultant sheet on a ceramic green sheet via an adhesion layer to prepare the resultant ceramic green sheet in a plurality of numbers, and laminating the ceramic green sheets under heat and pressure."

JP 10-242644 A discloses "a method involving applying thermocompression bonding to each ceramic green sheet on which a conductor circuit is transcribed," and also discloses that the temperature at which the thermocompression bonding is applied is 80° C. or more and 150° C. or less and the pressure under which the thermocompression bonding is applied is 10 kgf/cm$^2$ or more and 300 kgf/cm$^2$ or less.

When any one of the above-mentioned methods disclosed in JP 2011-211033 A and JP 10-242644 A is appropriately used, the above-mentioned ceramic bonded compact is produced as described below. First, a ceramic green substrate, which is a precursor of a ceramic substrate (compact before firing), and ceramic green sheets, which are precursors of a ceramic film (compacts before firing), are prepared. Subsequently, a layer of a paste for bonding which contains a ceramic powder, a dispersion medium, and a binder is formed on the bonding surface of each of the ceramic green sheets. Then, while the state in which the paste layer is dry, and the bonding surface of each of the ceramic green sheets on which the paste layer is formed and the bonding surface of the ceramic green substrate are in contact with each other is kept, the ceramic green substrate and the ceramic green sheets are subjected to thermocompression bonding at a temperature of roughly 80° C. or more and 150° C. or less and a press pressure of roughly 10 kgf/cm$^2$ or more and 300 kgf/cm$^2$ or less. As a result, a green bonded compact (state before firing) formed of the ceramic green substrate and the ceramic green sheets is provided. This green bonded compact is fired, yielding the above-mentioned ceramic bonded compact.

By the way, the above-mentioned ceramic green substrate (compact before firing of a ceramic substrate) has hole portions, and hence the ceramic green substrate is liable to have deformation and cracking when an external force is applied. Owing to the fact, there has been a problem in that the ceramic green substrate is liable to have deformation and cracking when the above-mentioned thermocompression bonding is applied thereto.

SUMMARY OF THE INVENTION

The inventors of the present invention have found a method of producing a "green bonded compact in which a green film is bonded on each bonding surface of a green substrate having hole portions" as described above, the method providing better adhesiveness to a thin green film, while suppressing the green substrate from having deformation and cracking, in comparison to the production methods described in the above-mentioned literatures.

A method of producing a bonded compact according to the present invention is a method involving bonding, to each bonding surface of "a porous plate-like green substrate having hole portions, the green substrate being obtained by forming a slurry containing a first inorganic powder, a dispersion medium, and a binder into a compact, followed by solidification," "a green sheet which is thinner than the green substrate, the green sheet being obtained by forming a slurry containing a second inorganic powder having a different composition or a different microstructure from that of the first inorganic powder, a dispersion medium, and a binder into a compact, followed by solidification". This production method includes first to third steps. Herein, the first and second inorganic powders typically are ceramic powders but may be metal powders.

In the first step, a layer of a paste for bonding which contains a dispersion medium and a binder is formed on the bonding surface of each green sheet preliminarily prepared. The paste layer may contain an inorganic powder (ceramic powder). An inorganic powder having the same composition and microstructure as those of the first inorganic powder, an inorganic powder having the same composition and microstructure as those of the second inorganic powder, or an inorganic powder having a different composition or a different microstructure from those of the first and second inorganic powders may be used as the inorganic powder contained in the paste layer.

Examples of a method of forming this paste layer include a method using printing and a method using a dispenser. It is suitable that the thickness of the paste layer formed in the first step is 2 μm or more and 20 μm or less in a dry state (in a state in which the paste layer is dried after being formed).

In the second step, the bonding surface of the green sheet on which the paste layer is formed is brought into contact, in a state in which the paste layer is not dry, with the bonding surface of the green substrate preliminarily prepared. The bonding pressure at this time may be a pressure corresponding to the self weight of the green sheet, but the bonding pressure is preferably 0.05 kgf/cm$^2$ or more and 0.5 kgf/cm$^2$ or less. That is, this bonding pressure is extremely small, in comparison to the bonding pressure applied at the time of the thermocompression bonding described in the above-mentioned literature. Thus, in the second step, the green substrate is difficult to have deformation and cracking. The porosity of the green substrate is 40% or more and 70% or less, and the average diameter of the pores in the green substrate is 0.03 μm or more and 2 μm or less.

In the third step, the pores in the green substrate are caused to absorb the dispersion medium in the paste layer, thus drying the paste layer and thereby bonding the green substrate and the green sheet. It is a capillary action that causes the pores in the porous green substrate to absorb the dispersion medium in the paste layer. Note that the green sheet is preferably a dense film having a smaller porosity than that of the green substrate. When the absorption of the dispersion medium in the paste layer (which causes drying of the paste layer) progresses by virtue of the capillary action as described above, each thin green sheet (film) can be caused to adhere closely to the bonding surface of the porous green substrate successfully.

As described above, the production method according to the present invention provides a green bonded compact in which a porous green substrate is suppressed from having deformation and cracking and each thin green film has good adhesiveness.

In the above-mentioned method of producing the green bonded compact according to the present invention, it is suitable to use a thermosetting resin as the binder contained in the green substrate. A urethane resin is more preferably used as the thermosetting resin.

The dispersion medium (organic solvent, solvent) used in the paste for bonding is required to have "the characteristic of not dissolving the binder contained in the green substrate." Few kinds of solvents dissolve a thermosetting resin (typically, a urethane resin or the like). In other words, very many kinds of solvents do not dissolve the thermosetting resin (typically, a urethane resin or the like). As described above, it is possible to broaden the option of an organic solvent used as the dispersion medium in the paste for bonding by adopting the above-mentioned constitution.

Similarly, it is suitable that a butyral resin having an average molecular weight of 40,000 or more (for example, BM-1 manufactured by SEKISUI CHEMICAL CO., LTD.) is used as the binder in the green sheet and that a butyral resin having an average molecular weight of 32,000 or less (for example, BL-5 manufactured by SEKISUI CHEMICAL CO., LTD.) is used as the binder in the paste layer. In particular, it is most suitable that a butyral resin having an average molecular weight of 52,000 (for example, BM-2 manufactured by SEKISUI CHEMICAL CO., LTD.) is used as the binder in the green sheet and that a butyral resin having an average molecular weight of 23,000 (for example, BL-S manufactured by SEKISUI CHEMICAL CO., LTD.) is used as the binder in the paste layer.

The dispersion medium (organic solvent, solvent) used in the paste for bonding is required to have "the characteristics of not dissolving the binder contained in the green sheet and of dissolving the binder contained in the paste for bonding." Very many kinds of "solvents do not dissolve a butyral resin having an average molecular weight of 40,000 or more but dissolve a butyral resin having an average molecular weight of 32,000 or less." Thus, it is also possible to broaden the option of an organic solvent used as the dispersion medium in the paste for bonding by adopting the above-mentioned constitution. It is possible to use, as such a dispersion medium in the paste for bonding, for example, butyl carbitol acetate (BCA), n-butyl acetate, or methyl isobutyl ketone (MIBK).

The bonded compact according to the present invention obtained by firing the above-mentioned green bonded compact manufactured by using the production method according to the present invention is a fired compact that includes "a plate-like substrate having hole portions and being formed of an inorganic material" and "a film which is bonded on each bonding surface of the substrate and has a thinner thickness than that of the substrate, the film being formed of an inorganic material having a different composition or a different microstructure from that of the substrate." Typically, the film is formed of a dense inorganic material having a smaller porosity than that of the substrate. The substrate may be formed of a porous inorganic material (ceramic) or may be formed of a dense inorganic material (ceramic). Note that, when each of the first and second inorganic powders is a ceramic powder, in the bonded compact, the substrate is formed of a ceramic and the film is formed of a ceramic having a different composition or a different microstructure from that of the substrate.

Hereinafter, some cases in which an inorganic powder is contained in the paste layer are additionally described. When an inorganic powder having the same composition and microstructure as those of the first inorganic powder is used as the inorganic powder contained in the paste layer, the boundary between the fired compact of the paste layer (fired layer) and the film remains after firing, but the fired compact of the paste layer (fired layer) and the substrate are integrated (the boundary between them disappears). When an inorganic powder having the same composition and microstructure as those of the second inorganic powder is used as the inorganic powder contained in the paste layer, the boundary between the fired compact of the paste layer (fired layer) and the substrate remains after firing, but the fired compact of the paste layer (fired layer) and the film are integrated (the boundary between them disappears). On the other hand, when an inorganic powder having a different composition or a different microstructure from those of the first and second inorganic powders is used as the inorganic powder contained in the paste layer, both the boundary between the fired compact of the paste layer (fired layer) and the substrate, and the boundary between the fired compact of the paste layer (fired layer) and the film remain after firing. Note that, when no inorganic powder is contained in the paste layer, all components in the paste layer are volatilized and removed after firing.

In this bonded compact, it is suitable that the ratio of the thickness (T1) of the thinnest portion of the substrate to the maximum length (L1) in the cross-sectional shape of each of the hole portions in the substrate, that is, T1/L1, is 0.04 or more and 0.69 or less. Typically, in this bonded compact, the substrate has a porosity of 0% or more and 45% or less, the film has a porosity of 0% or more and 10% or less, the substrate has a thickness of 1 mm or more and 8 mm or less, and the film has a thickness of 2 μm or more and 45 μm or less.

The inventors of the present invention have found that, in the bonded compact according to the present invention obtained by firing the above-mentioned green bonded compact manufactured by using the production method according to the present invention, when at least this condition is established, the substrate is suppressed from having deformation and cracking, and good adhesiveness is imparted to the thin film (the details thereof are mentioned below).

DETAILED DESCRIPTION OF THE INVENTION

Hereinafter, descriptions are given on the bonded compact according to an embodiment of the present invention and on some methods of producing the bonded compact, while the drawings are referred to.

(Constitution of Ceramic Bonded Compact)

Figure 1:
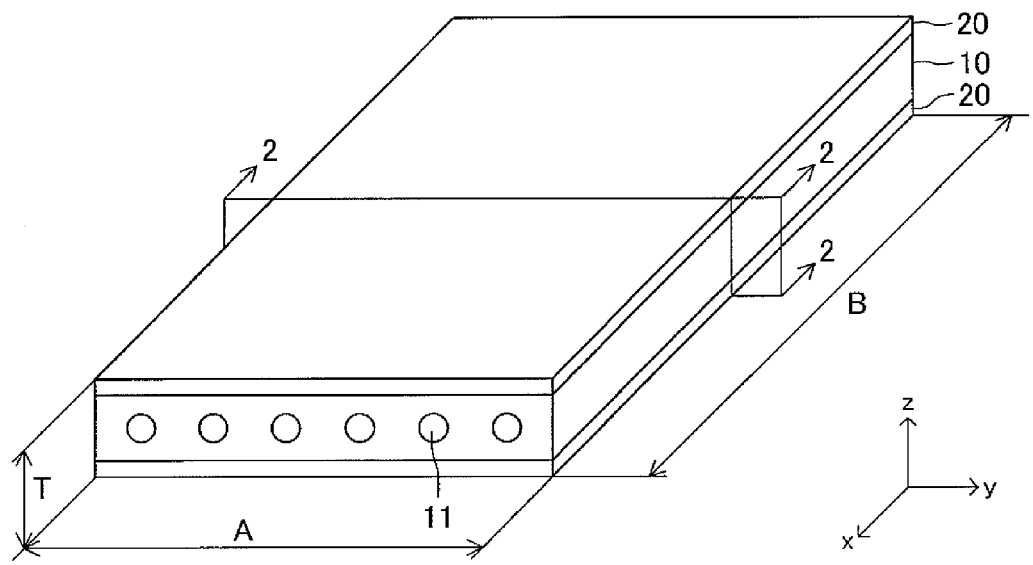
FIG. 1 is an entire perspective view of a ceramic bonded compact according to an embodiment of the present invention.
Figure 2:
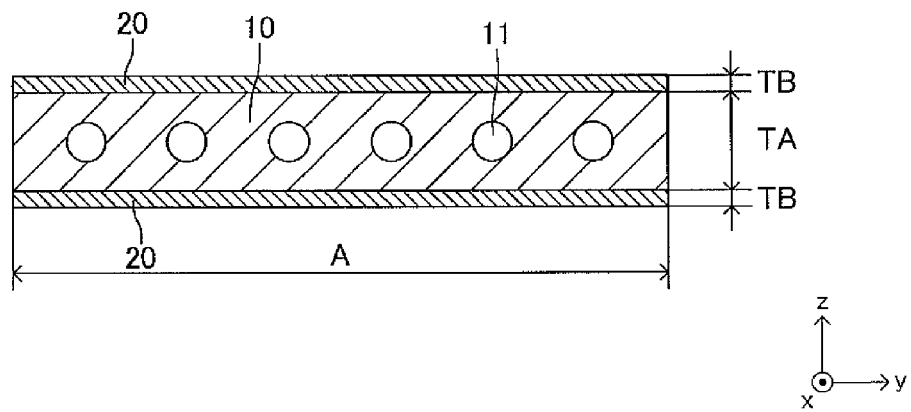
FIG. 2 is a cross-sectional view taken along the line 2-2 of FIG. 1.

FIG. 1 and FIG. 2 each illustrate the ceramic bonded compact according to an embodiment of the present invention. This bonded compact is a fired compact which is formed of a cuboid ceramic substrate 10 and ceramic films 20 and 20 each bonded on the top or bottom surface of the ceramic substrate 10. In this bonded compact, each of the ceramic films 20 and 20 is entirely formed on the top or bottom surface of the ceramic substrate 10. The width A (y-axis direction), length B (x-axis direction), and height T (z-axis direction) of this bonded compact are, for example, 10 mm or more and 100 mm or less, 50 mm or more and 500 mm or less, and 1 mm or more and 8 mm or less, respectively. Inside the ceramic substrate 10, a plurality of "through-holes 11 with circular cross-sections" each extending along the length direction (x-axis direction) are formed parallel to each other so as to be positioned with a predetermined pitch in the width direction (y-axis direction).

The ceramic substrate 10 is a porous or dense fired compact formed of a first ceramic. It is possible to use, as the first ceramic, for example, zirconium oxide, yttrium oxide, magnesium oxide, or nickel oxide. The ceramic substrate 10 has a porosity of 0% or more and 45% or less. When the ceramic substrate 10 has pores, the average diameter of the pores is 0.2 µm or more and 10 µm or less. The ceramic substrate 10 has a thickness (TA) of 1 mm or more and 8 mm or less. Note that herein, the term "pore" refers to a space formed in an object.

Each ceramic film 20 is thinner than the ceramic substrate 10 and is a dense fired film formed of a second ceramic. The second ceramic has a different composition or a different microstructure from that of the first ceramic. It is possible to use, as the second ceramic, for example, zirconium oxide. The porosity of the ceramic film 20 is smaller than that of the ceramic substrate 10 and is 0% or more and 10% or less. The ceramic film 20 has a thickness of 2 µm or more and 45 µm or less.

(Method of Producing Ceramic Bonded Compact)

Next, the method of producing a ceramic bonded compact illustrated in each of FIG. 1 and FIG. 2 is described while FIGS. 3 to 9 are referred to. Hereinafter, each member represented by a symbol followed by "g" in each figure refers to a "state before firing" (green). Further, a compact in a state before firing is simply referred to as a "compact," and a product obtained by firing the "compact" is referred to as a "fired compact."

Figure 3:
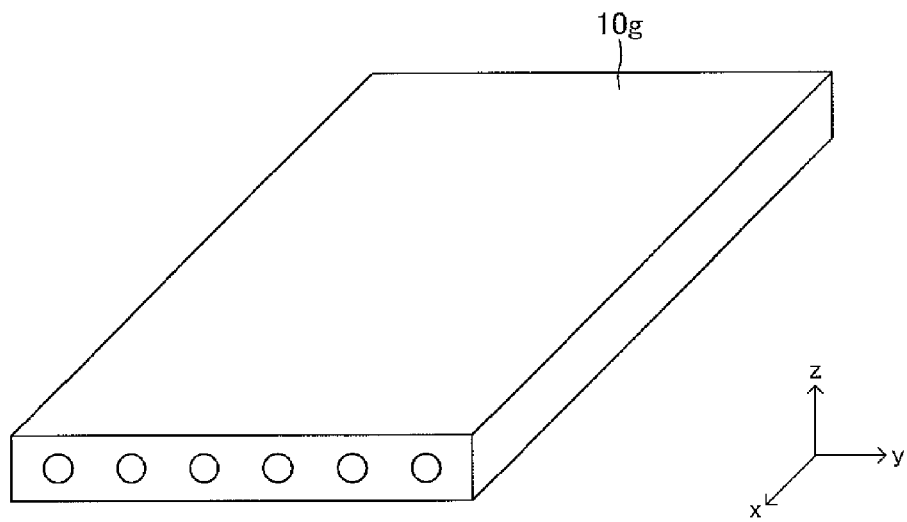
FIG. 3 is an entire perspective view of a ceramic green substrate used for manufacturing the bonded compact illustrated in FIG. 1.

First, as illustrated in FIG. 3, a porous ceramic green substrate 10g having a shape corresponding to that of the ceramic substrate 10 is prepared. That is, the ceramic green substrate 10g is a cuboid compact in which a plurality of through-holes with circular cross-sections each extending along the length direction (x-axis direction) are formed parallel to each other so as to be positioned with a predetermined pitch in the width direction (y-axis direction). The ceramic green substrate 10g has a porosity of 40% or more and 70% or less, and the average diameter of the pores thereof is 0.03 µm or more and 2 µm or less. The ceramic green substrate 10g has a thickness of 1 mm or more and 12 mm or less.

The ceramic green substrate 10g is obtained by forming a "slurry containing a first ceramic powder, a dispersion medium, and a binder" into a compact having a shape corresponding to that of the ceramic substrate 10, followed by solidification. It is possible to use, as the first ceramic powder, for example, a powder of "a mixture of yttrium oxide, magnesium oxide, and nickel oxide." The median diameter of the powder of "a mixture of yttrium oxide, magnesium oxide, and nickel oxide" is, for example, 0.9 µm or more and 10 µm or less. Note that the term "zirconium oxide" includes a material containing an added element such as yttria stabilized zirconia.

As the dispersion medium, there may be used a hydrocarbon-based dispersion medium (e.g., toluene, xylene, or solvent naphtha), an ether (e.g., ethylene glycol monoethyl ether, butyl carbitol, or butyl carbitol acetate), an alcohol (e.g., isopropanol, 1-butanol, ethanol, 2-ethylhexanol, terpineol, ethylene glycol, or glycerin), a ketone (e.g., acetone or methyl ethyl ketone), an ester (e.g., butyl acetate, dimethyl glutarate, or triacetylene), or a polybasic acid (e.g., glutaric acid). There is particularly preferably used a solvent having 2 or more ester bonds such as a polybasic acid ester (e.g., dimethyl glutarate) or an acid ester of a polyhydric alcohol (e.g., triacetylene). As the binder, there may be used, for example, an isocyanate or a polyol such as ethylene glycol.

Note that the ceramic green substrate 10g may include a pore-forming agent (which is a material disappearing by firing, for example, particles of an acrylic resin). As a result, the parts occupied by the pore-forming agent among the parts which are not pores in the state of the ceramic green substrate 10g turn to pores in the ceramic substrate 10 obtained after firing. In this case, large pores (such as pores each having a diameter of 2 µm or more and 10 µm or less) can be formed inside the ceramic substrate 10.

It is possible to use, as the binder, a gelator (thermosetting resin) such as a urethane resin, the gelator being solidified by a gelation reaction (chemical reaction such as a urethane reaction, which occurs between an isocyanate and a polyol). In this case, the ceramic green substrate 10g can be obtained by injecting the slurry into a mold having a molding space corresponding to the shape of the ceramic substrate 10, and forming and solidifying the slurry into a compact through the gelation reaction of the binder. This technique is also called a "gel-casting method." Note that a different material from the gelator (that is, a material which is not solidified by a chemical reaction but is solidified only by drying) may be used as the binder.

Figure 4:
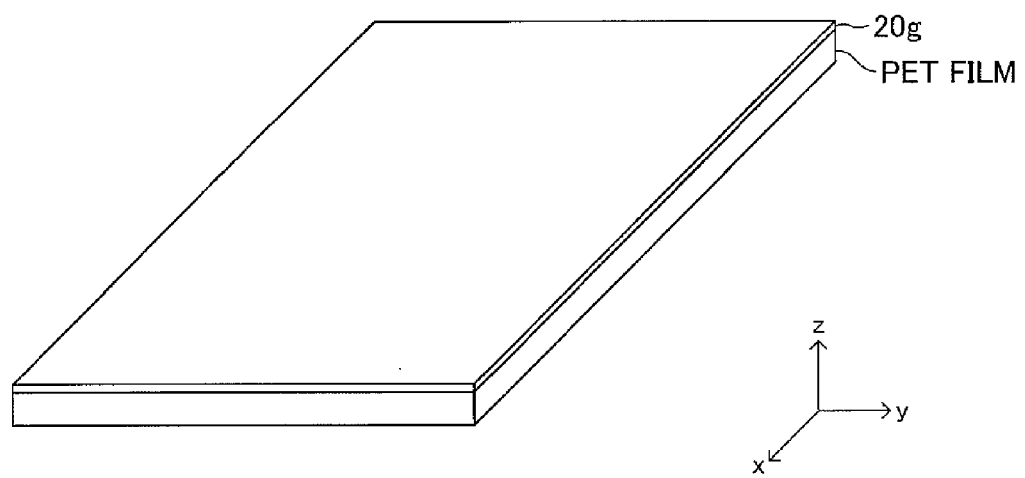
FIG. 4 is an entire perspective view of a "ceramic green sheet with a PET film" used for manufacturing the bonded compact illustrated in FIG. 1.

In addition, as illustrated in FIG. 4, a ceramic green sheet 20g having a shape corresponding to that of the ceramic film 20 is prepared. That is, the ceramic green sheet 20g is a cuboid compact which is thinner than the ceramic green substrate 10g. In addition, the filling factor of the ceramic powder in the ceramic green sheet 20g is 38 vol % or more and 60 vol % or less. The ceramic green sheet 20g has a thickness of 2 µm or more and 50 µm or less.

The ceramic green sheet 20g is very thin and liable to deform, and hence the ceramic green sheet 20g is prepared in the state of being attached to a PET film (hereinafter, referred to as a "sheet with a PET film 20g" as illustrated in FIG. 4. Two sets of sheets with a PET film 20g are prepared. Herein, the PET film corresponds to the "carrier." A material except the PET film may be used as the "carrier."

The ceramic green sheet 20g is obtained by forming a "slurry containing a second ceramic powder, a dispersion medium, and a binder" into a compact, followed by solidification, and cutting the compact into a piece having a shape corresponding to the shape of the ceramic film 20. The second ceramic powder has a different composition or a different microstructure from that of the first ceramic powder. It is possible to use, as the second ceramic powder, for example, a powder of zirconium oxide. The median diameter of the powder of zirconium oxide is, for example, 0.2 µm or more and 0.9 µm or less. It is possible to use, as the dispersion medium, for example, a mixed liquid of xylene and butanol. It is possible to use, as the binder, for example, a butyral resin having an average molecular weight of 40,000 or more (for example, BM-1 manufactured by SEKISUI CHEMICAL CO., LTD.).

Figure 5:
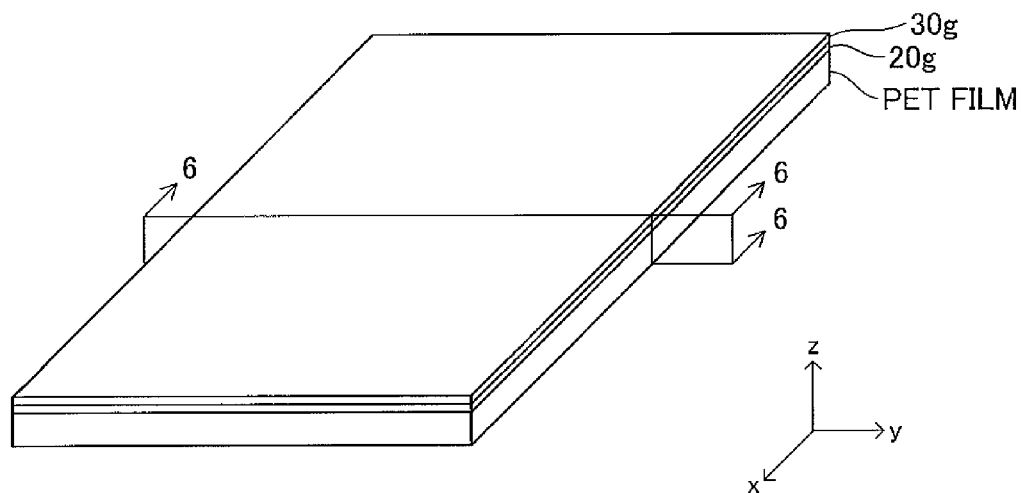
FIG. 5 is an entire perspective view illustrating a state in which a paste layer for bonding is formed on the ceramic green sheet illustrated in FIG. 4.

Next, for each sheet with a PET film 20g, under normal temperature, a paste layer 30g for bonding is formed on the bonding surface of the sheet 20g (the surface on the side in which a PET film is not attached in the sheet 20g) as illustrated in FIG. 5. Examples of a method of forming the paste layer 30g include a method using printing and a method using a dispenser.

The thickness of the paste layer 30g is 2 µm or more and 20 µm or less in a dry state (in a state in which the paste layer is dried after being formed). Note that the reason why a value in the dry state is used as an index for the thickness of the paste layer 30g is that it is very difficult to measure the film thickness of the paste layer 30g in a state in which the paste layer 30g is not dry (hereinafter, referred to as a "wet state").

The paste used to form the paste layer 30g includes a dispersion medium and a binder, and may include a ceramic powder. Hereinafter, the case in which the paste layer 30g includes a "ceramic powder having the same composition (chemical formula) and the same microstructure (particle diameter) as those of the second ceramic powder" is taken as an example to continue the description.

It is possible to use, as the dispersion medium, for example, butyl carbitol acetate (BCA), n-butyl acetate, or methyl isobutyl ketone (MIBK). It is possible to use, as the binder, for example, a butyral resin having an average molecular weight of 32,000 or less (for example, BL-5 manufactured by SEKISUI CHEMICAL CO., LTD.).

Figure 6:
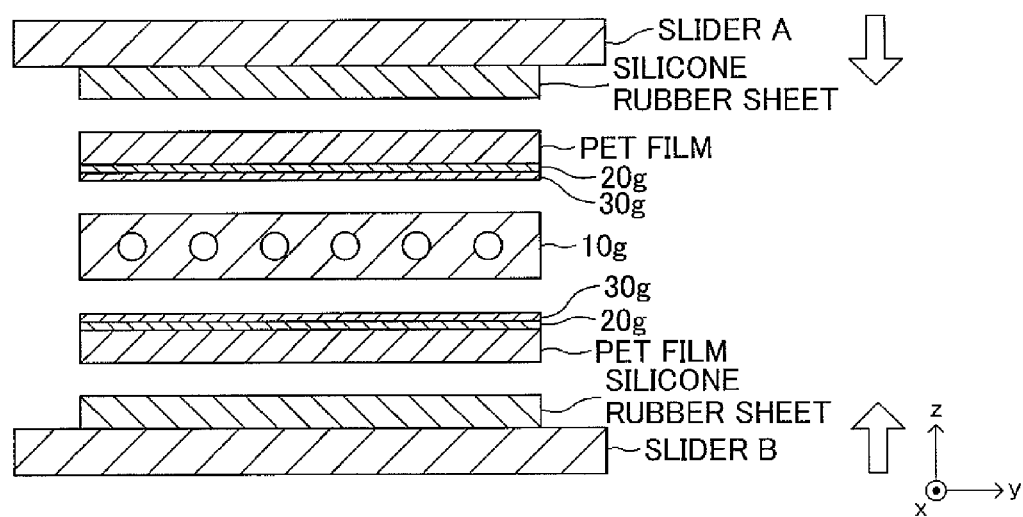
FIG. 6 is a view illustrating how a ceramic green sheet is bonded on each of the top and bottom surfaces of the ceramic green substrate.

Subsequently, while each of the paste layers 30g is maintained in a "wet state" under normal temperature, the ceramic green substrate 10g is sandwiched by the two sheets with a PET film 20g each arranged at the upper position or lower position of the substrate 10g as illustrated in FIG. 6. As a result, each of the top and bottom surfaces (bonding surfaces) of the ceramic green substrate 10g is brought into contact with the bonding surface of each of the sheets with a PET film 20g via each of the paste layers 30g in the wet state.

As can be understood from FIG. 6, the press pressure of each of the upper and lower sheets with a PET film 20g and 20g with respect to the ceramic green substrate 10g is adjusted by adjusting the driving state (press state) of each of a slider A and a slider B which press the sheets with a PET film 20 g and 20g via silicone rubber sheets. Note that some other sheets formed of a soft material may be used instead of the silicone rubber sheets, and for example, a urethane foam sheet may be used.

It is suitable that the press pressure (bonding pressure) of the two sheets with a PET film 20 g with respect to the ceramic green substrate 10g is 0.05 kgf/cm$^2$ or more and 0.5 kgf/cm$^2$ or less. Such a press state is continued at normal temperature for, for example, 10 seconds or more and 300 seconds or less.

Figure 7:
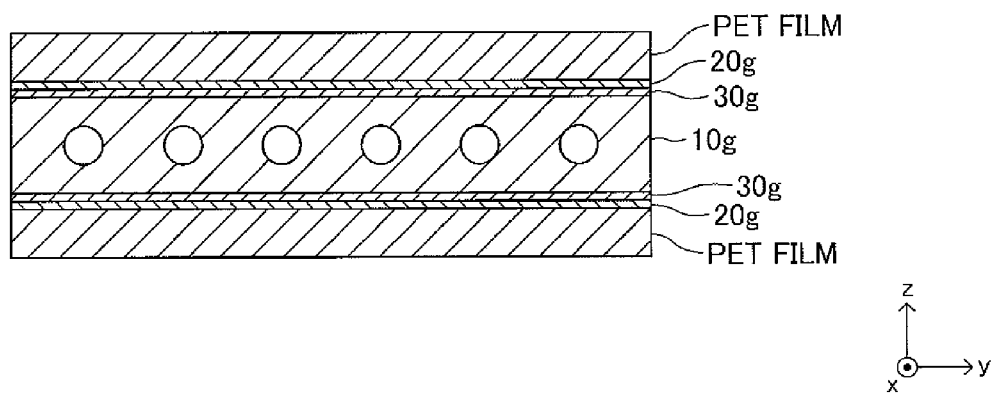
FIG. 7 is a view illustrating a ceramic green bonded compact in which a "ceramic green sheet with a PET film" is bonded on each of the top and bottom surfaces of the ceramic green substrate.

While this press state is continued under normal temperature, the dispersion medium in each of the paste layers 30g in the wet state is gradually absorbed into the pores in the ceramic green substrate 10g by virtue of a capillary action. The drying of the paste layers 30g progresses with the absorption. The drying of the paste layers 30g results in providing, as illustrated in FIG. 7, a "bonded compact in which the sheets with a PET film 20g are each bonded on the top or bottom surface of the ceramic green substrate 10g." Note that, in order to cause the drying of the paste layers 30g to progress more reliably, after the completion of the press state, the bonded compact may undergo drying treatment (heat treatment) at about 50° C. or more and 150° C. or less for about 5 minutes or more and 60 minutes or less.

Figure 8:
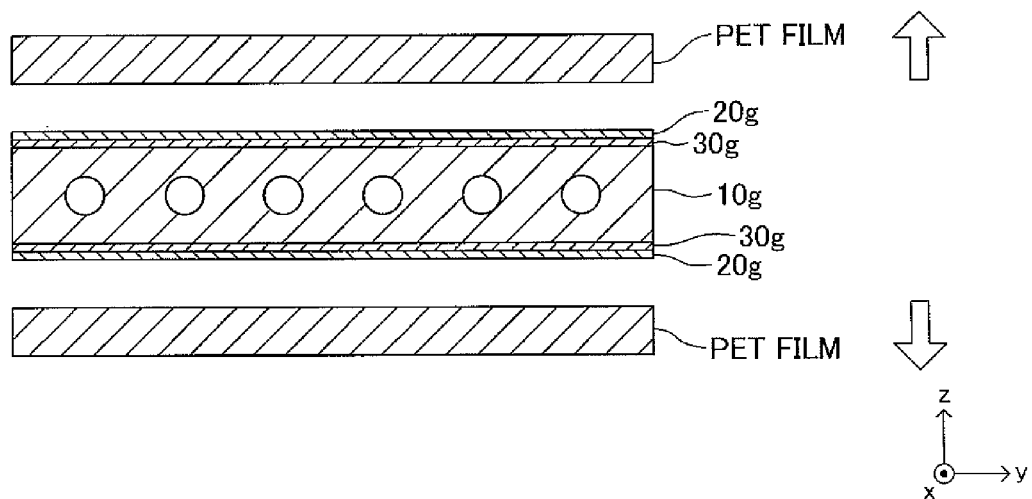
FIG. 8 is a view illustrating how each PET film is detached in the state illustrated in FIG. 7.

Subsequently, as illustrated in FIG. 8, the PET films are detached from the bonded compact illustrated in FIG. 7, resulting in providing a "ceramic green bonded compact in which the ceramic green sheets 20g are each bonded on the top or bottom surface of the ceramic green substrate 10g."

Then, the ceramic green bonded compact is subjected to degreasing at 400° C. or more and 750° C. or less for 1 hour or more and 10 hours or less. After that, the degreased ceramic green bonded compact is fired at 1,350° C. or more and 1,600° C. or less for 1 hour or more and 10 hours or less. As a result, the dispersion medium and binder remaining inside the ceramic green bonded compact are volatilized and removed, yielding the fired compact illustrated in FIG. 9 (that is, the ceramic bonded compact illustrated in each of FIG. 1 and FIG. 2).

Figure 9:
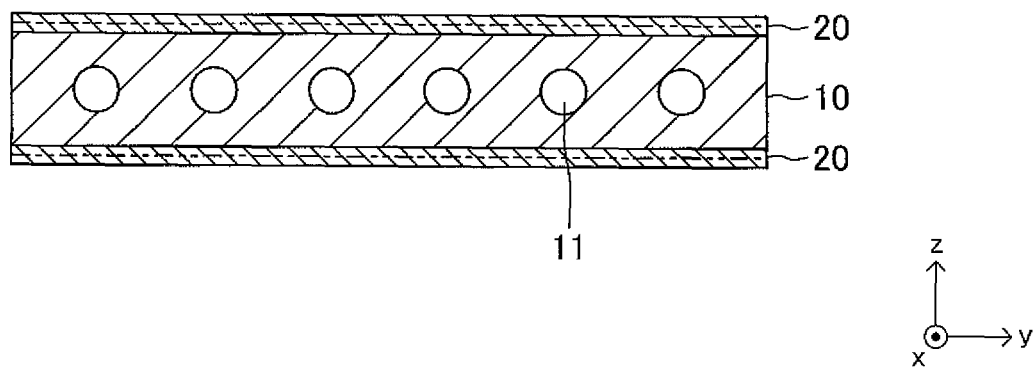
FIG. 9 is a view illustrating a state of a fired compact of a ceramic green bonded compact obtained by detaching each PET film.

Note that, as described above, a ceramic powder having the same composition (chemical formula) and the same microstructure (particle diameter) as those of the second ceramic powder is used as the ceramic powder included in the paste layers 30g in the case of this example. By virtue of the fact, as illustrated in FIG. 9, the boundary between each of the fired compacts of the paste layers (fired layers) and the ceramic substrate 10 remains after firing, but the fired compacts of the paste layers (fired layers) and the ceramic film 20 are integrated (the boundary between them disappears).

(Action and Effect)

As described above, when the method of producing a ceramic bonded compact according to this embodiment is used, the drying of the paste layers 30g is caused to progress by taking advantage of a capillary action positively. By virtue of the fact, the ceramic green sheets 20g can closely adhere to and bond to the porous ceramic green substrate 10g successfully, even if the bonding pressure is as very small as 0.05 kgf/cm² or more and 0.5 kgf/cm² or less. Thus, provided is a ceramic green bonded compact in which the "ceramic green substrate 10g that is liable to deform by an external force because of having through-holes" is suppressed from having deformation and cracking and the thin ceramic green sheets 20g have good adhesiveness. As a result, in the fired compact of this ceramic green bonded compact (ceramic bonded compact) as well, the ceramic substrate 10 is suppressed from having deformation and cracking, and the dense ceramic films 20 have good adhesiveness.

Further, the dispersion medium (organic solvent, solvent) used in the paste for bonding is required to have "the characteristics of not dissolving the binder contained in the ceramic green substrate, of not dissolving the binder contained in the ceramic green sheet, and of dissolving the binder contained in the paste for bonding."

From this point of view, a thermosetting resin (typically, a urethane resin) is preferably used as the binder contained in the ceramic green substrate. Very many kinds of solvents do not dissolve a thermosetting resin (typically, a urethane resin or the like). Thus, it is possible to broaden the option of an organic solvent used as the dispersion medium in the paste for bonding by using such a thermosetting resin.

Similarly, it is suitable that a butyral resin having an average molecular weight of 40,000 or more is used as the binder in the ceramic green sheet and that a butyral resin having an average molecular weight of 32,000 or less is used as the binder in the paste layers. Very many kinds of "solvents do not dissolve a butyral resin having an average molecular weight of 40,000 or more but dissolve a butyral resin having an average molecular weight of 32,000 or less." Thus, it is also possible to broaden the option of an organic solvent used as the dispersion medium in the paste for bonding by using such butyral resins.

Hereinafter, a description is given on a test which has confirmed that the method of producing a ceramic bonded compact according to this embodiment (specifically, a film-forming method) is advantageous in comparison to other conventional film-forming methods from the viewpoints of "suppressing deformation and cracking of a ceramic substrate" and "securing the denseness of ceramic films."

(Test)

Figure 10:
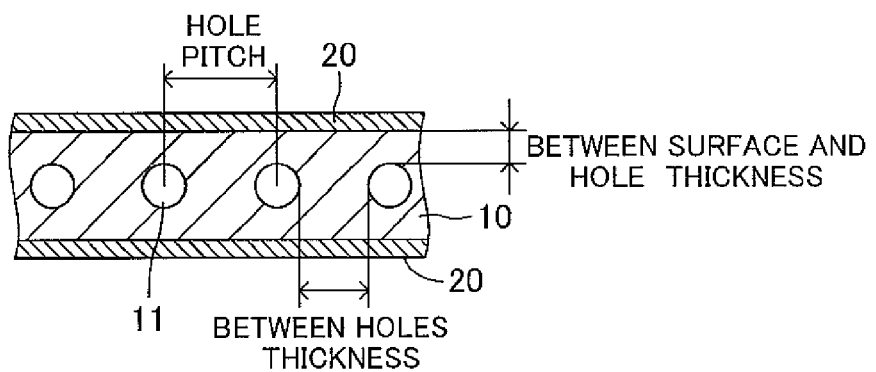
FIG. 10 is a first view illustrating a size of each portion in a ceramic bonded compact (fired compact)
Figure 11:
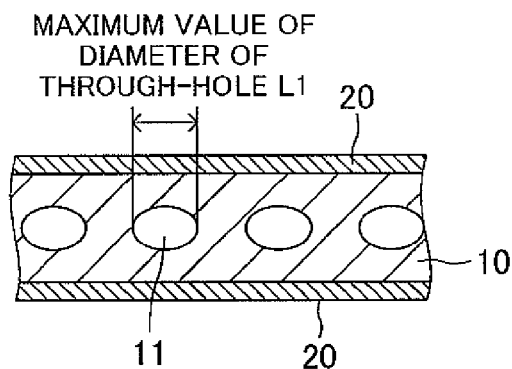
FIG. 11 is a second view illustrating a size of a portion in a ceramic bonded compact (fired compact)
Figure 12:
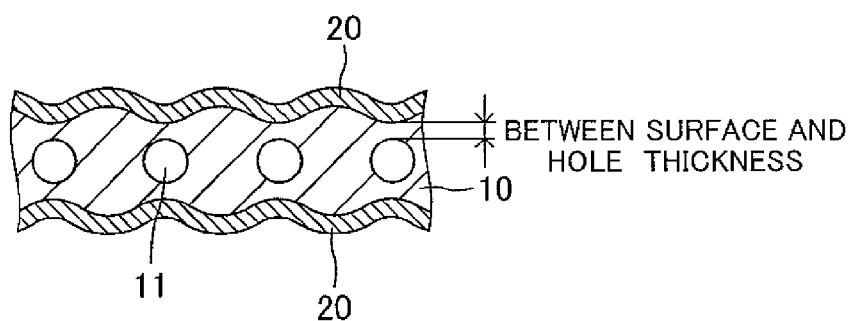
FIG. 12 is a third view illustrating a size of a portion in a ceramic bonded compact (fired compact)

In this test, attention was paid to "the maximum length L1 in the cross-sectional shape of a through-hole" and "the thickness T1 of the thinnest portion of a ceramic substrate" (see FIGS. 10 to 12), which were considered to influence significantly the ease of the occurrence of the deformation and cracking of the ceramic substrate. When a through-hole has a circular cross-sectional shape as illustrated in FIG. 10 and FIG. 12, the diameter thereof can be adopted as L1, and when a through-hole has an oval cross-sectional shape as illustrated in FIG. 11, the major axis thereof can be adopted as L1. Out of the smallest thickness between a surface of the ceramic substrate and a through-hole, and the smallest thickness between adjacent through-holes, the smaller value was adopted as T1.

In this test, as shown in Table 1, seven kinds (S1 to S7) of substrate shape patterns were worked out, the seven kinds having different combinations of the surface shape of a ceramic substrate (flat or waved), the thickness of a ceramic substrate, the cross-sectional shape of a through-hole, the maximum value L1 of the diameter of a through-hole, and the pitch between through-holes (thus, the combination of L1 and T1 varies). The value "T1/L1" was calculated as an index value for representing the ease of the occurrence of the deformation and cracking of a ceramic substrate with reference to each substrate shape pattern. When the surface shape of a ceramic substrate is a wave shape (see FIG. 12), the height difference between a peak and a valley is about 0.1 mm. Note that the values in Table 1 refer to the sizes of each fired compact (ceramic bonded compact).

TABLE 1

| | Substrate shape | | | | | Thickness | | | |
| --- | --- | --- | --- | --- | --- | --- | --- | --- | --- |
| Combination No. | Surface shape | Thickness [mm] | Shape of holes | Maximum value of diameter of through-hole L1 [mm] | Pitch between through-holes [mm] | Between surface and hole [mm] | Between holes [mm] | Minimum Value T1 [mm] | T1/L1 |
| S1 | Flat | 3.00 | Circle | 1.52 | 3.05 | 0.74 | 1.53 | 0.74 | 0.49 |
| S2 | Waved | 3.00 | Circle | 1.52 | 3.05 | 0.74 | 1.53 | 0.74 | 0.49 |
| S3 | Waved | 3.00 | Oval | 2.00 | 3.05 | 0.50 | 1.05 | 0.50 | 0.25 |
| S4 | Waved | 3.00 | Circle | 2.80 | 3.05 | 0.10 | 0.25 | 0.10 | 0.04 |
| S5 | Flat | 3.00 | Circle | 1.52 | 2.10 | 0.74 | 0.58 | 0.58 | 0.38 |
| S6 | Flat | 5.00 | Circle | 1.52 | 2.10 | 1.74 | 0.58 | 0.58 | 0.38 |
| S7 | Flat | 5.00 | Circle | 1.80 | 3.05 | 1.60 | 1.25 | 1.25 | 0.69 |

In this test, as shown in Table 2, a printing method and "the thermocompression bonding method described in the Description of the Related Art" were introduced to perform a method of forming a ceramic green film (sheet) in comparative examples to be compared with this embodiment. As shown in Table 2, in this embodiment, five kinds (M1 to M5) of film-forming patterns were worked out, the five kinds having different combinations of the thickness of a ceramic green sheet, the thickness of a paste layer, and the bonding pressure. When the printing method (which did not require a ceramic green sheet) was performed, three kinds (M6 to M8) of film-forming patterns in which paste layers having different thicknesses were used were worked out. When the thermocompression bonding method was performed, four kinds (M9 to M12) of film-forming patterns were worked out, the four kinds having different combinations of the thickness of a ceramic green sheet, the thickness of a paste layer, and the bonding pressure. Note that the values in Table 2 refer to the sizes of each compact before firing (ceramic green bonded compact).

TABLE 2

Film-forming condition

| Combination No. | Film-forming method | Thickness of sheet [μm] | Thickness of paste layer [μm] (Drying) | Bonding pressure [kgf/cm²] |
|---|---|---|---|---|
| M1 | This embodiment | 2 | 6 | 0.1 |
| M2 | | 5 | 8 | 0.05 |
| M3 | | 5 | 8 | 0.5 |
| M4 | | 10 | 8 | 0.1 |
| M5 | | 50 | 8 | 0.1 |
| M6 | Comparative | — | 20 | — |
| M7 | Example | — | 10 | — |
| M8 | (Printing) | — | 6 | — |
| M9 | Comparative | 5 | 8 | 100 |
| M10 | Example | 5 | 8 | 10 |
| M11 | (Thermocompression | 5 | 8 | 50 |
| M12 | bonding) | 2 | 6 | 50 |

Hereinafter, a case in which a ceramic substrate (thus, a ceramic green substrate) has wave surfaces is additionally described. In the case of this example, the height difference between a peak and a valley in the surface wave shape is about 0.1 mm. Thus, when this embodiment and the thermocompression bonding method are performed, even if a configuration in which silicone rubber sheets press ceramic green sheets via PET films which are relatively difficult to deform is adopted as illustrated in FIG. 6 described above, the PET films (thus, ceramic green sheets) can deform along the surface shapes (wave shapes) of the ceramic green substrate. As a result, a pressure can be applied uniformly to the ceramic green sheets in the press state. As a result, the ceramic green sheets can deform along the surface shapes (wave shapes) of the ceramic green substrate while the film thickness of each ceramic green sheet is constantly maintained. As a result, as illustrated in FIG. 12, each of the ceramic green sheets (thus, fired ceramic films) bonded to the surfaces (wave shapes) of the ceramic green substrate can have a uniform film thickness.

Note that a pressure can be applied uniformly to the ceramic green sheets in the press state by using cold isostatic pressing (CIP) or the like, and as a result, as illustrated in FIG. 12, the ceramic green sheets can be deformed along the surface shapes (wave shapes) of the ceramic green substrate similarly as described above, and each of the ceramic green sheets can have a uniform film thickness. Each value representing the sheet thickness shown in Table 2 refers to a value representing this "uniform film thickness" obtained by performing this embodiment and the thermocompression bonding method.

On the other hand, when the printing method is applied to a ceramic substrate (thus, ceramic green substrate) having wave surface shapes, each ceramic green film thickness (that is, paste layer thickness) cannot be uniform. Thus, each value representing the paste layer thickness shown in Table 2 refers to the average value of the thicknesses of the paste layers obtained by performing the printing method.

In the case of this embodiment, it is separately confirmed that a ceramic bonded compact can be realized, in which ceramic films closely adhere to the bonding surfaces of a ceramic substrate entirely and "the flatness of the bonding surfaces of the ceramic substrate corresponds to 0.5 times or more and 20 times or less of the (uniform) thickness of the ceramic films." Herein, the flatness refers to a value defined on the basis of JIS B0621. When at least the printing method is used as a film-forming method, such a ceramic bonded compact cannot be realized.

In this test, for each of the above-mentioned substrate shape patterns S1 to S7 (see Table 1), each ceramic green film was formed by using one of the above-mentioned film-forming patterns M1 to M12 (see Table 2). Each of the resultant ceramic green bonded compacts was fired, yielding 7 by 12 kinds of ceramic bonded compacts. The width A and length B (see FIG. 1) of each of the ceramic bonded compacts were 50 mm and 100 mm, respectively. Ceramic materials used for forming the ceramic substrate and ceramic films in each of the ceramic bonded compacts were "a mixture of yttrium oxide, magnesium oxide, and nickel oxide," and zirconium oxide, respectively. Each ceramic substrate had a porosity of 0% or more and 45% or less. Then, each ceramic substrate was evaluated for the presence or absence of deformation and cracking of the ceramic substrate, and the denseness of each ceramic film. Tables 3 to 5 show the results. In Tables 3 to 5, "○" refers to "excellent," "Δ" refers to "good," and "x" refers to "bad."

TABLE 3

Quality determination (Deformation and cracking of substrate)

| | | Condition for forming film | | | | | | | | | | | |
|---|---|---|---|---|---|---|---|---|---|---|---|---|---|
| | | M1 | M2 | M3 | M4 | M5 | M6 | M7 | M8 | M9 | M10 | M11 | M12 |
| Substrate shape | S1 | ○ | ○ | ○ | ○ | ○ | ○ | ○ | ○ | x | Δ | x | x |
| | S2 | ○ | ○ | ○ | ○ | ○ | ○ | ○ | ○ | x | Δ | x | x |
| | S3 | ○ | ○ | ○ | ○ | ○ | Δ | Δ | Δ | x | x | x | x |
| | S4 | ○ | ○ | ○ | ○ | ○ | Δ | Δ | Δ | x | x | x | x |
| | S5 | ○ | ○ | ○ | ○ | ○ | ○ | ○ | ○ | x | x | x | x |
| | S6 | ○ | ○ | ○ | ○ | ○ | ○ | ○ | ○ | x | x | x | x |
| | S7 | ○ | ○ | ○ | ○ | ○ | ○ | ○ | ○ | x | Δ | x | x |

TABLE 4

Quality determination (Denseness of film)

| | | Condition for forming film | | | | | | | | | | | |
|---|---|---|---|---|---|---|---|---|---|---|---|---|---|
| | | M1 | M2 | M3 | M4 | M5 | M6 | M7 | M8 | M9 | M10 | M11 | M12 |
| Substrate shape | S1 | o | o | o | o | o | Δ | Δ | x | o | o | o | o |
| | S2 | o | o | o | o | o | x | x | x | o | Δ | o | o |
| | S3 | o | o | o | o | o | x | x | x | o | Δ | o | o |
| | S4 | o | o | o | o | o | x | x | x | o | Δ | o | o |
| | S5 | o | o | o | o | o | Δ | Δ | x | o | o | o | o |
| | S6 | o | o | o | o | o | Δ | Δ | x | o | o | o | o |
| | S7 | o | o | o | o | o | Δ | Δ | x | o | o | o | o |

TABLE 5

Quality determination (Total)

| | | Condition for forming film | | | | | | | | | | | |
|---|---|---|---|---|---|---|---|---|---|---|---|---|---|
| | | M1 | M2 | M3 | M4 | M5 | M6 | M7 | M8 | M9 | M10 | M11 | M12 |
| Substrate shape | S1 | o | o | o | o | o | Δ | Δ | x | x | Δ | x | x |
| | S2 | o | o | o | o | o | x | x | x | x | Δ | x | x |
| | S3 | o | o | o | o | o | x | x | x | x | x | x | x |
| | S4 | o | o | o | o | o | x | x | x | x | x | x | x |
| | S5 | o | o | o | o | o | Δ | Δ | x | x | x | x | x |
| | S6 | o | o | o | o | o | Δ | Δ | x | x | x | x | x |
| | S7 | o | o | o | o | o | Δ | Δ | x | x | Δ | x | x |

Table 3 shows the results of evaluation for the presence or absence of deformation and cracking of each ceramic substrate. As can be understood from Table 3, when this embodiment (M1 to M5) and the printing method (M6 to M8) are performed, the deformation and cracking of each ceramic substrate do not occur (or occur to a relatively small extent). This is probably based on the fact that a relatively strong external force (bonding pressure) is not applied to each ceramic green substrate at the time of film formation. On the other hand, when the thermocompression bonding method (M9 to M12) is performed, the deformation and cracking of each ceramic substrate often occur. This is probably based on the fact that a relatively strong external force (bonding pressure) is applied to each ceramic green substrate at the time of film formation.

Table 4 shows the results of evaluation for the denseness of each ceramic film. As can be understood from Table 4, when this embodiment (M1 to M5) and the thermocompression bonding method (M9 to M12) are performed, the denseness of each ceramic film is very high. On the other hand, when the printing method (M6 to M8) is performed, the denseness of each ceramic film is very low.

Table 5 shows the results of comprehensive evaluation based on the results in Table 3 and Table 4. In Table 5, "o" refers to "a case in which both evaluation results in Tables 3 and 4 are "o"," "Δ" refers to "a case in which at least one of the evaluation results in Tables 3 and 4 is not "o," but both evaluation results in Tables 3 and 4 are not "x"," and "x" refers to "a case in which at least one of the evaluation results in Tables 3 and 4 is "x"".

As can be understood from Tables 3 to 5, it can be said that this embodiment (M1 to M5) is advantageous in comparison to the printing method (M6 to M8) and the thermocompression bonding method (M9 to M12) from the viewpoints of "suppressing deformation and cracking of a ceramic substrate" and "securing the denseness of ceramic films." Further, when attention is also paid to the value "T1/L1" in Table 1, in addition to those results, it can also be said that, as long as the value "T1/L1" is in the range of 0.04 or more and 0.69 or less (M1 to M5), this embodiment is advantageous in comparison to the printing method and the thermocompression bonding method from the viewpoints of "suppressing deformation and cracking of a ceramic substrate" and "securing the denseness of ceramic films."

Figure 13:
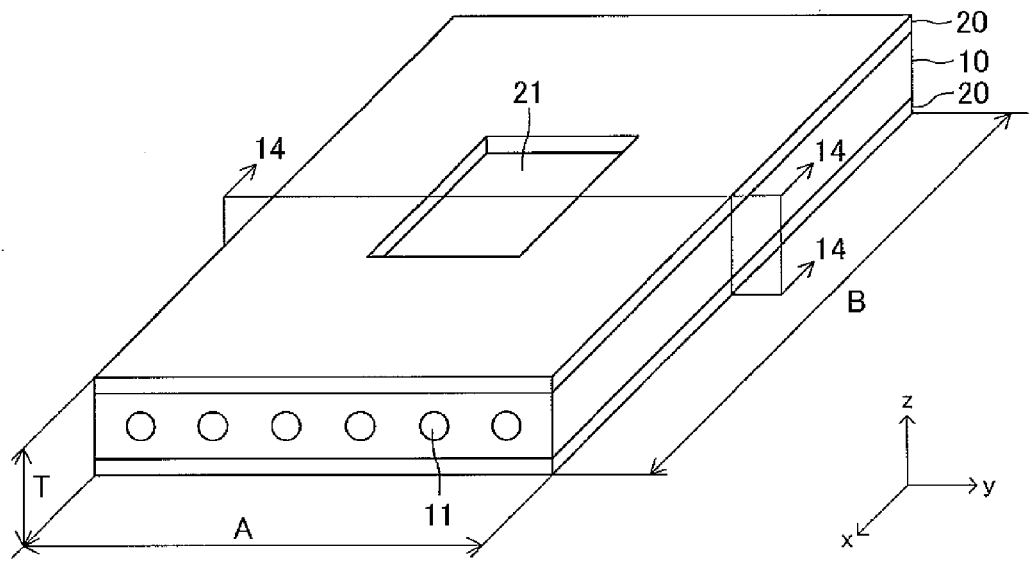
FIG. 13 is a perspective view of a ceramic bonded compact according to a variation example of the embodiment of the present invention, the view corresponding to FIG. 1.
Figure 14:
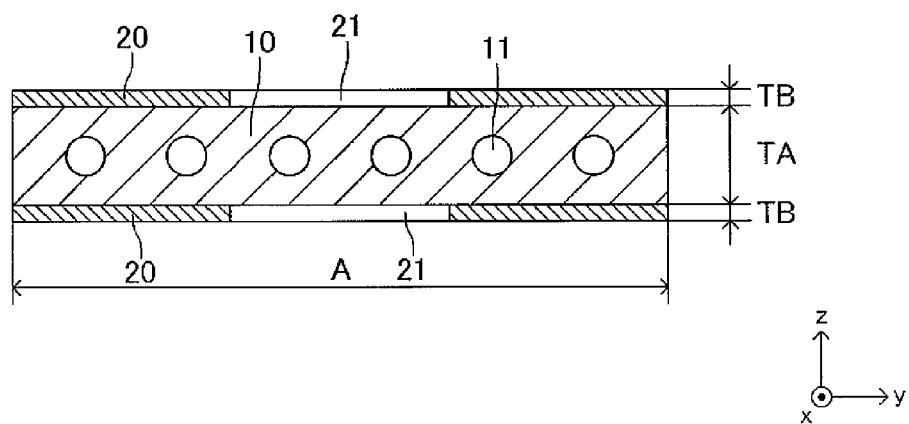
FIG. 14 is a cross-sectional view taken along the line 14-14 of FIG. 13.

Hereinafter, a brief description is given on a variation example of the above-mentioned embodiment illustrated in FIGS. 1 to 9 while FIGS. 13 to 19 are referred to. FIG. 13 and FIG. 14 correspond to FIG. 1 and FIG. 2, respectively, and FIGS. 15 to 19 correspond to FIGS. 5 to 9, respectively.

As can be understood from the comparison of FIG. 1 and FIG. 2 with FIG. 13 and FIG. 14, this variation example is different from the above-mentioned embodiment in which each ceramic film 20 is entirely formed on the top or bottom surface of the ceramic substrate 10, only in the respect that a part in which the ceramic film 20 is not formed (hereinafter, referred to as a "window portion 21") is present on the central portion of each of the top and bottom surfaces of the ceramic substrate 10.

Figure 15:
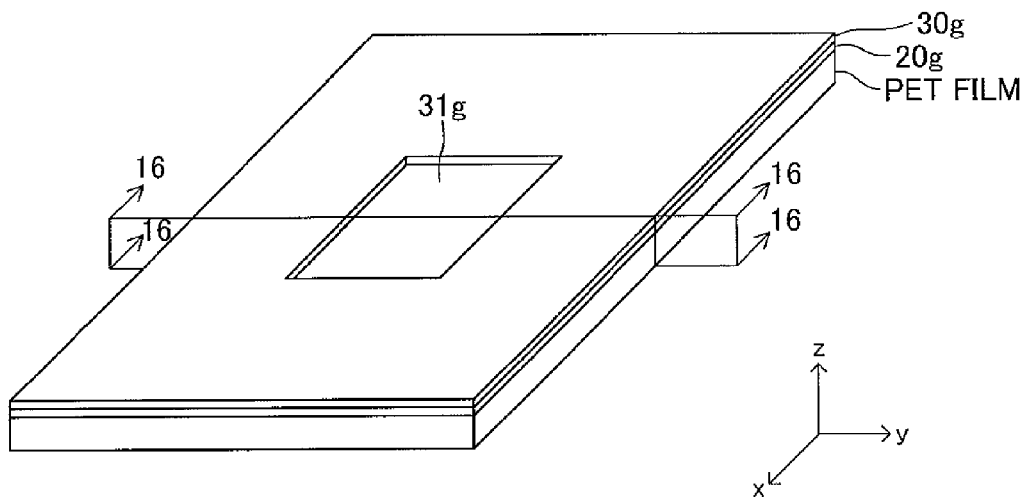
FIG. 15 is a perspective view of the bonded compact illustrated in FIG. 13, the view corresponding to FIG. 5.
Figure 16:
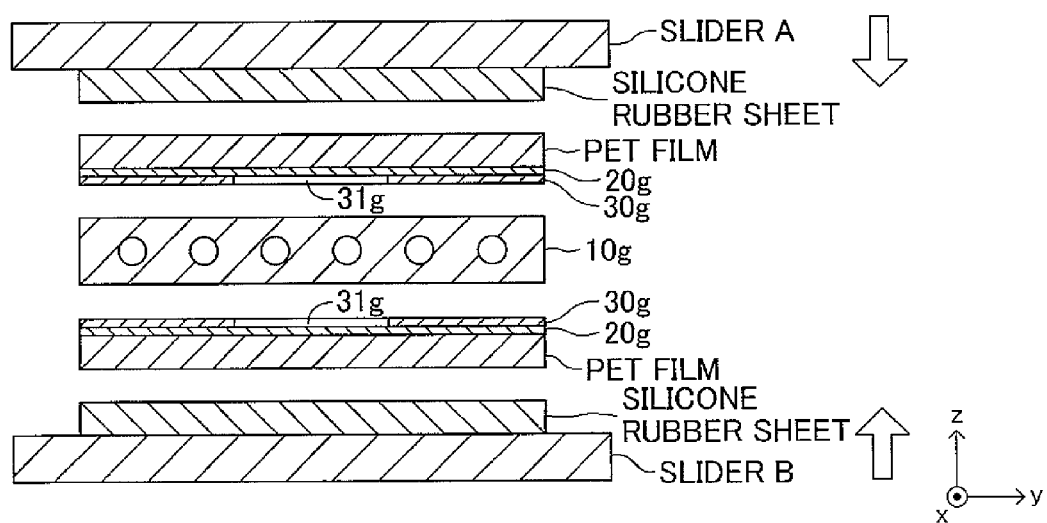
FIG. 16 is a view of the bonded compact illustrated in FIG. 13, the view corresponding to FIG. 6.

In this variation example, the above-mentioned window portion 21 is formed, and hence the following technique is adopted. That is, as illustrated in FIG. 15, on the bonding surface of the sheet with a PET film 20g, the paste layer 30g is not formed at the part corresponding to the above-mentioned window portion 21 (hereinafter, referred to as a "window corresponding portion 31g"), and the paste layer 30g is formed at the remaining part. In this case, it is suitable to adopt, as a method of forming the paste layer 30g, the printing method. The precise outline pattern of the window corresponding portion 31g can be provided by adopting the printing method.

Figure 17:
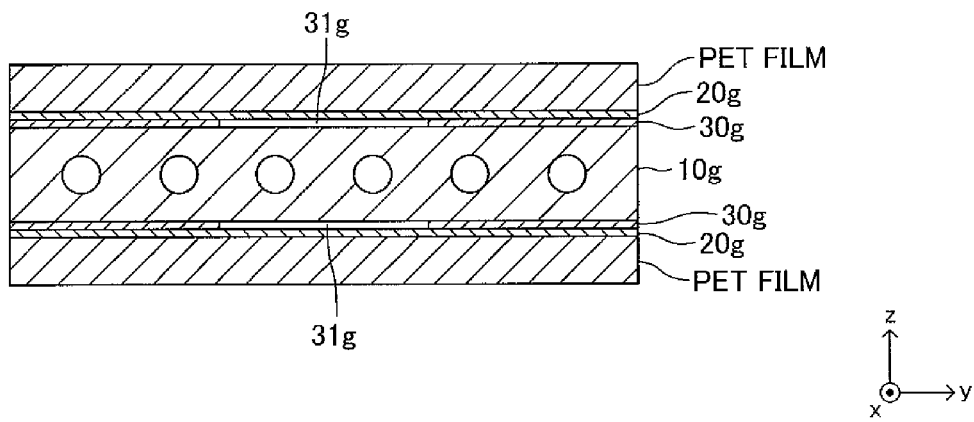
FIG. 17 is a view of the bonded compact illustrated in FIG. 13, the view corresponding to FIG. 7.
Figure 18:
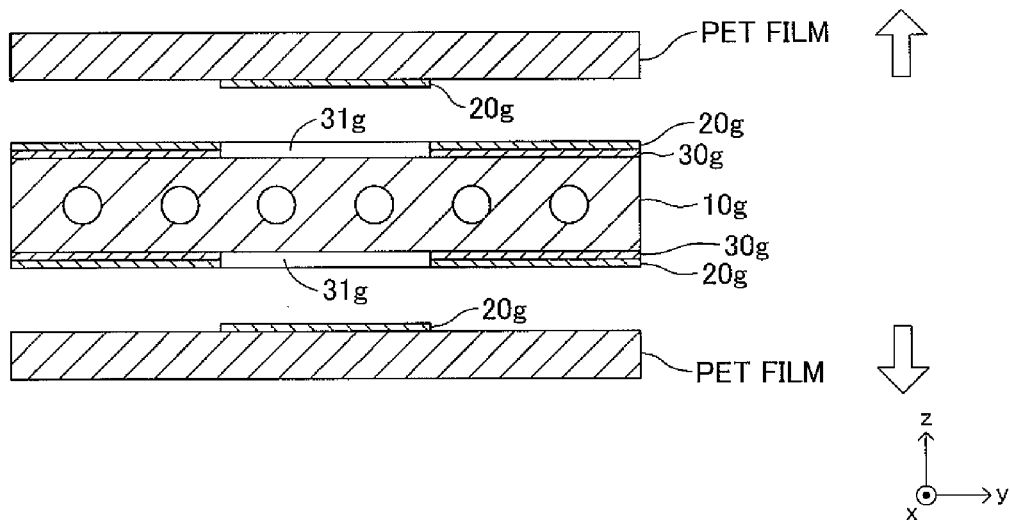
FIG. 18 is a view of the bonded compact illustrated in FIG. 13, the view corresponding to FIG. 8.

As described above, in a case where the paste layers 30g are formed in order for the window corresponding portions 31g to be present, as illustrated in FIG. 18, when the sheets with a PET film 20g are pressed and then each PET film is detached from the green bonded compact illustrated in FIG. 17, the parts not corresponding to the window corresponding portions 31g (that is, the parts on which the paste layers 30g are formed) in the ceramic green sheets 20g are maintained in the state of closely adhering to the bonding surfaces of the ceramic green substrate 10g. On the other hand, the parts corresponding to the window corresponding portions 31g (thus, the parts on which the paste layers 30g are not formed) are removed in the state of being attached to the PET films together with the PET films. As a result, as illustrated in FIG. 19, the window portions 21 are formed.

Note that, to be exact, in the vicinity of the part corresponding to the window corresponding portion 31g in each ceramic green sheet 20g, incompletely removed parts may remain as remaining parts. As the thickness of the ceramic green sheet 20g is larger, this tendency becomes larger. Those remaining parts in which unnecessary parts are not removed may be removed by using an adhesive roller or the like.

It has been found by adopting the technique described above that, when a part in which a ceramic film is formed and a part in which no ceramic film is formed are present on each bonding surface of a ceramic substrate, the edge portion of the ceramic film corresponding to "the boundary between the part in which the ceramic film is formed and the part in which no ceramic film is formed" (in FIG. 19, each edge portion of each ceramic film 20 corresponding to the outline of each window portion 21) has a stable shape.

Figure 19:
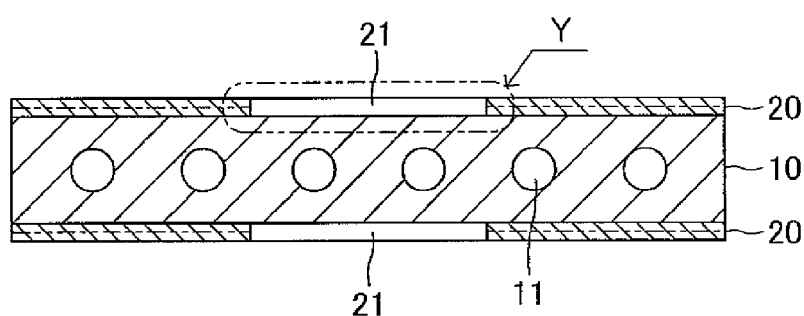
FIG. 19 is a view of the bonded compact illustrated in FIG. 13, the view corresponding to FIG. 9.
Figure 19:
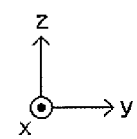
Figure 20:
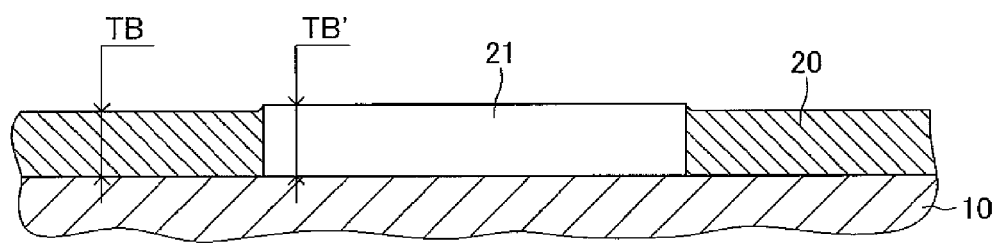
FIG. 20 is an enlarged view of a Y portion of FIG. 19.

Specifically, it is separately confirmed that, when the average value of the thicknesses of the ceramic film 20 is represented by TB and the thickness of the edge portion of the ceramic film 20 is represented by TB' as illustrated in FIG. 20 which is an enlarged view of FIG. 19, the value "TB'/TB" stably falls within the range of 0.7 or more and 1.3 or less in the entire circumference of the outline of the window portion 21. Note that the value "TB'/TB" refers to a value in the fired compact.

Figure 21:
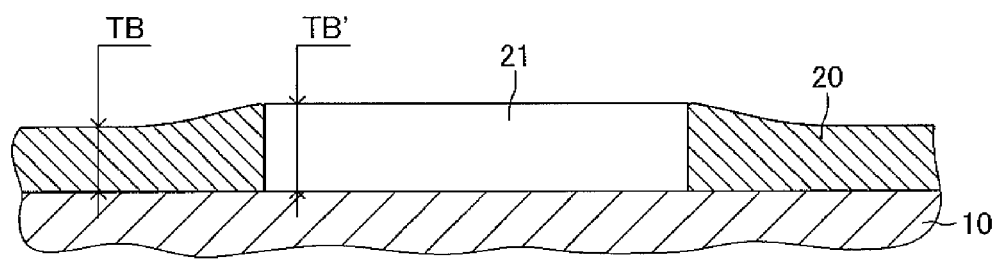
FIG. 21 is a view according to a comparative example, the view corresponding to FIG. 20.

Note that, in order to form the above-mentioned window portion 21, it may be possible to adopt a technique in which "a masking member is placed in the region corresponding to the window portion 21 on the bonding surface of the ceramic green substrate 10g, and then, while the state is maintained, a paste layer is formed by dipping in the region excluding the window portion 21, the paste layer is dried, and the masking member is then removed." However, in this case, as illustrated in FIG. 21, the shape of the edge portion of the ceramic film 20 corresponding to the outline of the window portion 21 is difficult to be stable. In other words, the value "TB'/TB" does not stably falls within the range of 0.7 or more and 1.3 or less. This probably results from the fact that the shape of the edge portion of the ceramic film 20 is influenced by "the contact angle of a paste with respect to the material of a masking member."

The present invention is not limited to the above-mentioned embodiment and variation example, and other various variation examples can be adopted in the scope of the present invention. In the above-mentioned embodiment and variation example, a through-hole is adopted as the "hole portion" of the ceramic substrate, but, for example, a recessed portion (unpenetrated hole) may be adopted. Further, in the above-mentioned embodiment and variation example, the substrate is "a ceramic substrate formed of a ceramic" and the film is "a ceramic film formed of a ceramic having a different composition or a different microstructure from that of the substrate," but the substrate may be "a substrate formed of a metal" and the film may be "a film formed of a metal having a different composition or a different microstructure from that of the substrate." Further, any one of the substrate and the film may be formed of a ceramic and the other may be formed of a metal.

Further, in each of the above-mentioned embodiment and variation example, the ceramic substrate and the ceramic films have different ceramic compositions, but the ceramic substrate and the ceramic films may have the same ceramic composition and different ceramic microstructures (such as a porosity and a particle diameter).

Further, in each of the above-mentioned embodiment and variation example, the ceramic substrate is formed of a porous or dense ceramic and the ceramic films are formed of a dense ceramic. However, not only the ceramic substrate but also the ceramic films may be formed of a porous ceramic.

Further, in each of the above-mentioned embodiment and variation example, the bonded compact is placed under normal temperature in the press state (see FIG. 6 and FIG. 16), but the bonded compact may be heated in the press state. With this, the rate of progress in the drying of the paste layers can be further enhanced.

What is claimed is:

1. A bonded compact which is a fired compact, comprising:
  a plate-like substrate having hole portions and being formed of an inorganic material, and
  a film, which is bonded on each bonding surface of the substrate, and has a thinner thickness than that of the substrate, the film being formed of an inorganic material having at least one of a different composition and a different microstructure from that of the substrate,
  wherein a ratio (T1/L1) of a thickness (T1) of a thinnest portion of the substrate to a maximum length (L1) in a cross-sectional shape of each of the hole portions in the substrate is 0.04 or more and 0.69 or less,
  wherein the film is formed of a dense inorganic material having a smaller porosity than that of the substrate, and
  wherein the part on which the film is formed in the bonding surface of the substrate has a flatness corresponding to 0.5 times or more and 20 times or less of the average value of the thicknesses of the film.

2. A bonded compact according to claim 1, wherein:
  the bonding surface of the substrate has a part on which the film is formed and a part on which no film is formed; and
  a ratio (TB'/TB) of a thickness (TB') of an edge portion of the film, the edge portion corresponding to a boundary between the part on which the film is formed and the part on which no film is formed, to an average value (TB) of thicknesses of the film is 0.7 or more and 1.3 or less.

3. A bonded compact according to claim 1, wherein the substrate has a porosity of 0% or more and 45% or less.

4. A bonded compact according to claim 1, wherein the film has a porosity of 0% or more and 10% or less.

5. A bonded compact according to claim 1, wherein the substrate has a thickness of 1 mm or more and 8 mm or less, and the film has a thickness of 2 μm or more and 45 μm or less.

6. A bonded compact according to claim 1, wherein:
the substrate is formed of a ceramic; and
the film is formed of a ceramic having one of a different composition and a different microstructure from that of the substrate.

* * * * *